United States Patent [19]
Breckel et al.

[11] Patent Number: 4,738,133
[45] Date of Patent: Apr. 19, 1988

[54] VEHICULAR TESTING SYSTEM

[75] Inventors: Werner Breckel, Wendlingen; Ulrich Schlienz, Ebersbach-Rosswälden, both of Fed. Rep. of Germany

[73] Assignee: Robert Bosch GmbH, Stuttgart, Fed. Rep. of Germany

[21] Appl. No.: 896,437

[22] Filed: Aug. 13, 1986

[30] Foreign Application Priority Data

Oct. 31, 1985 [DE] Fed. Rep. of Germany ....... 3538687

[51] Int. Cl.$^4$ .......................................... G01M 15/00
[52] U.S. Cl. ................. 73/117.3; 340/870.28
[58] Field of Search .............. 340/870.28, 870.12, 340/870.13; 324/402, 390; 73/146.5, 117.3, 128, 129

[56] References Cited

U.S. PATENT DOCUMENTS

| | | | |
|---|---|---|---|
| 2,677,822 | 5/1954 | Perilhou | 455/39 X |
| 4,503,431 | 3/1985 | Raab | 340/870.13 |
| 4,567,757 | 2/1986 | Melocik et al. | 73/129 |

FOREIGN PATENT DOCUMENTS

| | | |
|---|---|---|
| 1929044 | 12/1970 | Fed. Rep. of Germany . |
| 2732626 | 2/1978 | Fed. Rep. of Germany . |
| 3129471 | 2/1983 | Fed. Rep. of Germany . |
| 3410752 | 9/1985 | Fed. Rep. of Germany . |
| 2047932 | 12/1980 | United Kingdom . |
| 2169173 | 7/1986 | United Kingdom ........... 340/870.28 |

Primary Examiner—Jerry W. Myracle
Attorney, Agent, or Firm—Frishauf, Holtz, Goodman & Woodward

[57] ABSTRACT

To permit physical separation and movement between an automotive vehicle and a test or diagnostic apparatus, the transducers transmitting signals representative of vehicle operating characteristics are coupled to a wireless transmitter, for example operating in long-wave, ultra-short-wave, infrared or ultrasonic mode; the signals are received in a wireless receiver constructed to receive the respectively transmitted signals, for application to a test or diagnostic apparatus. The system permits relative movement between the vehicle and the normally stationary diagnostic or test apparatus, for example to carry out diagnosis during movement of the vehicle.

15 Claims, 1 Drawing Sheet

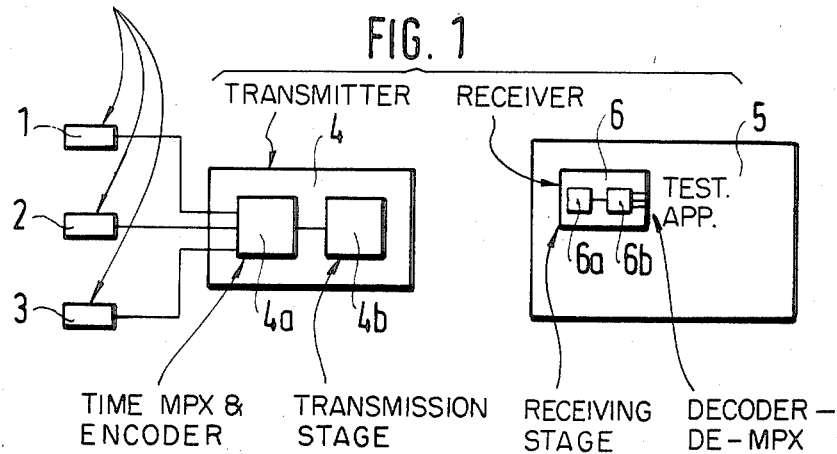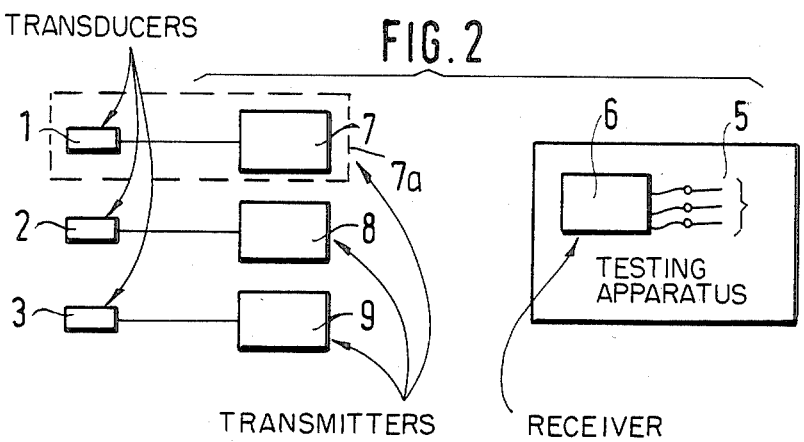

VEHICULAR TESTING SYSTEM

Cross reference to related disclosure: German Pat. No. DE-OS 14 10 752 assigned to the assignee of the present application.

The present invention relates to a vehicular testing system, and more particularly to a testing, diagnostic and monitoring system to test the operability of various apparatus, devices and equipment units installed in automotive vehicles by using a test apparatus responding to transducer signals provided by transducers installed in, or associated with the automotive vehicle.

BACKGROUND

Various types of test apparatus are known to check the functioning and operability of electrical apparatus in automotive vehicles, as well as of other apparatus which can be coupled to transducers providing electrical signals. Such test apparatus may, for example, check the proper operation of ignition control systems by determining the appropriate timing of current flow through an ignition coil, interruption of the current flow to determine spark advance or spark timing and the like; or, for example, to check the operation and timing of fuel injection systems, as well as the associated electronic control systems and apparatus. Other types of test apparatus permit checking the illumination system of an automotive vehicle, the voltage regulator of the generator or, for example, the control, operability, and performance of a brake anti-block system.

Testing electrical apparatus, or other apparatus coupled to a transducer, by use of test apparatus is well known. Coupling between the test apparatus and the transducers or a test socket is usually done by connecting a plurality of cables with the vehicle, interconnecting the respective transducers or electrical systems with a stationary test apparatus, remote from the vehicle, and, for example, forming the property of and installed in a service station or repair shop. German Patent Disclosure Document DE-OS 34 10 752 discloses a way to reduce the number of cables between the vehicle and the test apparatus by processing the measured signals to be transduced, for example by converting the signals into digital signals so that they can then be transmitted over a single cable to the test apparatus. This arrangement substantially reduces the number of wires and cables which must be used to connect the vehicle to the test apparatus; yet, the vehicle and the test apparatus must be located in relatively close vicinity, and the vehicle must be coupled to the test apparatus by this "umbilical cord"; the vehicle and the test apparatus, thus, cannot be located at random positions and, further, the vehicle cannot be operated, for example driven, over any but the most restricted distance without severing the test connections between the vehicle and the test or diagnostic apparatus.

THE INVENTION

It is an object to improve a testing system for a vehicle such that the vehicle and the test apparatus will be physically independent of each other.

Briefly, a wireless transmitter - receiver link is interposed between a transducer or a plurality of transducers installed or coupled to various elements in the automotive vehicle, and a receiver arranged and constructed to receive the signals from the wireless transmitter link, installed in a test apparatus or coupled thereto. Transmission is by radio in the ultra short wave range preferably the gigaHertz frequency range.

The arrangement has the advantage that a fixed cable connection between the test apparatus and the vehicle is no longer needed. Thus, the physical location or position of the vehicle and with respect to the test apparatus can be freely selected. This includes the further advantage that the vehicle could be moved, for example to provide diagnoses of operating conditions, e.g. the response of an anti-brake lock system (ABS). The elimination of a cable or, usually, a plurality of cables which often are tangled is a substantial advantage. This greatly contributes to the safety in automotive repair shops; cables stretched across walkways and the floor of repair shops frequently lead to accidents, since repair personnel may trip over the cables, hurt themselves, and/or damage the test apparatus, or transducers and cable connections on the vehicle, including for example plug-and-socket connectors.

In accordance with a preferred feature of the invention, the signals from the transducers on the vehicles are transmitted in time multiplex mode. One transmitter, thus, can transmit signals from a plurality of transducers. A plurality of signals can be taken off or sensed from the engine of the vehicle simultaneously, and transmitted sequentially. Frequency multiplex transmission is also possible in the alternative. Each sensor, then, will have associated therewith a specific discrete transmission channel. Transmission by means of one transmitter having a plurality of channels, or a plurality of transmitters is, thus, readily possible.

In accordance with another preferred feature of the invention, each transducer has a transmitter associated therewith; the transducer and transmitter may form one self-contained unit. Of course, the transmission range of the transmitter need not be extensive. The transducer and the transmitter can be matched optimally to each other and, upon suitable construction, the volume of transducer and transmitter can be small. Thus, transducers can be located at positions which are difficult to reach, for example already during manufacture of the vehicle, thereby avoiding high labor costs in installing the transmitter to monitor the specific function which is sensed by the transducer.

The test apparatus can be so arranged, in accordance with a preferred feature of the invention, that it receives only the signals of the channels which are to be checked. Frequency multiplex transmission, of course, does not exclude that the transmitter transmits signals from more than one sensor when, for example, the sensors must be located immediately adjacent each other in the vehicle.

DRAWINGS

FIG. 1 is a schematic diagram of an embodiment of the system; and

FIG. 2 illustrates another embodiment.

DETAILED DESCRIPTION

Three transducers or sensors 1, 2, 3 which, for example, are located at different points of the vehicle, provide output signals to a transmitter unit 4. Transducer 1, for example, may be a transducer in form of trigger tongs, in order to pick up ignition pulses in an ignition cable. The transducer 2 may be a volt-meter, coupled to measure the on-board network voltage of the vehicle. Transducer 3 may be a current sensor or ammeter, to measure the current in a portion of the on-board network of the vehicle. The three sensors 1, 2, 3 are connected to respective inputs of the transmitter 4. The transmitter 4 has a multiplexer and coding stage 4a which time-multiplexes the signals from the transducers 1, 2, 3 and, in time-multiplex mode transfers the signals to a transmission stage 4b. The transmission stage 4b provides, for example, a carrier signal which is modulated with the signals from the time multiplexer and encoder 4a which, in timed sequence, corresponds to the signals received from the transducers 1, 2, 3.

The signals are transmitted to a receiver 6 which is located in the test apparatus 5. The test apparatus 5, for example, is an engine tester. The receiver 6 has a receiving stage 6a and a decoder-demultiplexer 6b. The decoder-demultiplixing unit 6b has three output lines—see FIG. 1—which provide the signals, individually, transmitted from the transmission stage and, hence, corresponding to the signals provided by the transducers 1, 2, 3. The decoder-demultiplexer 6b, thus, separates the respective modulation signals in the individual transducing signals. The test apparatus has the usual inputs to receive the signals from the respective transducers to which the outputs from the stage 6b is connected.

For illustration, and for simplicity, only three sensors are shown; of course, many more sensors can be used, all connected to the transmitter 4, to be received in the receiver 6 for evaluation in the test apparatus 5. The test apparatus 5, itself, can be conventional, and processes the signals in conventional manner, e.g. by providing diagnostic displays or print-outs.

The wireless link between transmitter 4 and receiver 6 can be selected in accordance with known technology, as desired. For example, the link is a radio link, utilizing ultra-shortwave transmission with frequencies which may reach into the giga Hertz range. The wireless link may, however, also use different transmission modes, for example by ultrasonic signals or infrared (IR) signals. The transmission stage and the receiving stage, of course, may be matched; the receiving stage 6a is constructed to receive the signals transmitted by the transmission stage 4b.

In the embodiment of FIG. 2, each sensor 1, 2, 3 is connected to an individual transmitter 7, 8, 9. Sensors 1 and 7 may, for example, be combined as a single unit 7a, as illustrated by the broken lines. For example, the transmitter 7 can be combined, together with its current supply—which may be a battery—in the handle of a trigger tong connection forming the transducer 1. The transmitters 7, 8, 9 transmit on separate channels, each having an appropriate frequency range associated therewith. This permits simultaneous transmission of the transduced signals. Transmitters 7, 8, 9 may, of course, be combined into a single unit so that a single transmitter, transmitting on respectively different channels, can provide simultaneous output from the respective transducers. For example, the signals are modulated on auxiliary carriers, in a manner similar to that well known in frequency modulation transmission in which, simultaneously, entertainment programs and "store cast" signals are transmitted from a single transmitter, the "storecast" signals being modulated on a subcarrier, specifically coded to receive these signals, whereas the entertainment programs are radiated on the main carrier and not specifically coded. The receiver 6 in the test apparatus 5 is so constructed that it can receive, and decode or provide output signals, simultaneously, from a plurality of channels which correspond to the channels being transmitted by the respective transmitters 7, 8, 9 or a single transmitter unit providing the output signals on the respective channels. This permits simplification of the test apparatus. For example, if the test apparatus 5 requires only the signals from the transducers 1 and 3, the receiver 6 can be set to receive only two channels which, selectively, are set to receive the channels 7 and 9. The channel associated with the transmitter 8, or the transmission channel 8, may be associated with a special receiver, for example in a central repair station, where overall testing of multiple-performance functions is carried out.

The system permits testing and—if desired—adjusting or repairing of vehicles and vehicle components without connecting cables providing test signals between the vehicle and the test apparatus itself. The system, thus, also permits moving the vehicle; for example during a diagnostic test, the location between vehicle and test apparatus is freely selectable and the vehicle may be moved, for example, from one repair position to another without always moving the test apparatus along with it. Cables and other connectors interfering with free flow of work in a repair station are effectively eliminated.

We claim:

1. Vehicle testing or diagnostic system having
   a plurality of transducers (1, 2, 3) mounted on the vehicle and providing output signals representative of functioning, operability, or operating characteristics of apparatus forming part of the vehicle;
   a testing apparatus (5) separate from the vehicle and forming an apparatus unit selectively responsive to the output signals from the transducers to test the functioning, operability, or operating characteristics of the vehicle apparatus transduced by the transducer,
   comprising
   a wireless transmitter - receiver link between the transducers (1, 2, 3) and the test apparatus (5) including
   a plurality of wireless transmitters, one each associated with a respective transducer (1, 2, 3) receiving said output signals from the transducer,
   said transmitters transmitting signals representative of information derived from said transducers in the ultra short wave range of frequencies, and
   a wireless receiver (6) constructed to receive the signals transmitted by said transmitters, said receiver being coupled to the testing apparatus and providing signals representative of the transduced signals to the testing apparatus.

2. The system of claim 1, wherein the transmitters transmit the signals from the transducers in timemultiplex mode.

3. The system of claim 2, wherein the wireless transmitters transmit radio signals, and the frequency range of the signals transmitted by the wireless transmitters, and received by the receiver (6) is in the gigaHertz range.

4. The system of claim 1, wherein the transmitters transmit the signals from the respective transducers in frequency multiplex mode.

5. The system of claim 4, wherein the wireless transmitters transmit radio signals, and the frequency range of the signals transmitted by the wireless transmitter, and received by the receiver (6) is in the gigaHertz range.

6. The system of claim 1, wherein at least one transducer (1) and one transmitter (7) form a single, combined unit (7a).

7. The system of claim 1, wherein one of said transducers comprises an ignition pulse pick-up tong having the transmitter located physically on the tong structure.

8. The system of claim 1 wherein the wireless transmitters transmit radio signals, and the frequency range of the signals transmitted by the wireless transmitters, and received by the receiver (6) is in the gigaHertz range.

9. Vehicle testing or diagnostic system having
at least one transducer (1,2,3) mounted on the vehicle and providing output signals representative of functioning, operability or operating characteristics of apparatus forming part of the vehicle;
a testing apparatus (5) separate from the vehicle and forming an apparatus unit selectively responsive to the output signals from the at least one transducer to test the functioning, operability or operating characteristics of the vehicle apparatus transduced by the transducer,
comprising
a wireless transmitter - receiver link (7,8,9-6) between the at least one transducer (1,2,3) and the test apparatus (5) including
a plurality of transmitters (7,8,9) one each associated with the respective transducers; and
a wireless receiver (6) constructed to receive the signals transmitted by said transmitters, said receiver being coupled to the testing apparatus and providing signals representative of the transduced signals to the testing apparatus.

10. The system of claim 9, wherein at least one transducer (1) and one transmitter (7) form a single, combined unit (7a).

11. The system of claim 10, wherein one of said transducers comprises an ignition pulse pick-up tong having the transmitter located physically on the tong structure.

12. The system of claim 11 wherein the wireless transmitters transmit radio signals, and the frequency range of the signals transmitted by the wireless transmitters, and received by the receiver (6) is in the gigaHertz range.

13. The system of claim 10, wherein the wireless transmitters transmit radio signals, and the frequency range of the signals transmitted by the wireless transmitter, and received by the receiver (6) is in the gigaHertz range.

14. The system of claim 9 wherein the wireless transmitters transmit radio signals, and the frequency range of the signals transmitted by the wireless transmitters, and received by the receiver (6) is in the gigaHertz range.

15. The system of claim 9, wherein said plurality of transmitters transmit on separate channels, each having a unique transmission frequency range associated therewith to permit simultaneous transmission of signals from said plurality of transmitters.

* * * * *